United States Patent
Saadatmand et al.

(10) Patent No.: US 7,394,079 B2
(45) Date of Patent: Jul. 1, 2008

(54) ARCHITECTURE FOR RIBBON ION BEAM ION IMPLANTER SYSTEM

(75) Inventors: Kourosh Saadatmand, Merrimac, MA (US); Peter L. Kellerman, Essex, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 289 days.

(21) Appl. No.: 11/275,772

(22) Filed: Jan. 27, 2006

(65) Prior Publication Data

US 2007/0176122 A1    Aug. 2, 2007

(51) Int. Cl.
*H01J 37/317* (2006.01)

(52) U.S. Cl. .................................. 250/492.21

(58) Field of Classification Search ............. None
See application file for complete search history.

(56) References Cited

U.S. PATENT DOCUMENTS

| | | | |
|---|---|---|---|
| 5,091,655 A | | 2/1992 | Dykstra et al. |
| 5,177,366 A | * | 1/1993 | King et al. ............... 250/492.2 |
| 5,350,926 A | | 9/1994 | White et al. |
| 5,481,116 A | * | 1/1996 | Glavish et al. ......... 250/396 ML |
| 5,693,939 A | * | 12/1997 | Purser ......................... 250/251 |
| 6,060,715 A | * | 5/2000 | England et al. ........ 250/492.21 |
| 6,774,377 B1 | * | 8/2004 | Rathmell et al. ....... 250/492.21 |
| 7,173,260 B2 | * | 2/2007 | Anc et al. ................ 250/492.1 |
| 2005/0269526 A1 | * | 12/2005 | Rathmell ............... 250/492.21 |
| 2006/0017010 A1 | * | 1/2006 | Vanderberg et al. ...... 250/492.1 |
| 2006/0113493 A1 | * | 6/2006 | Kabasawa et al. ...... 250/492.21 |

FOREIGN PATENT DOCUMENTS

| | | | |
|---|---|---|---|
| EP | 1662545 A2 | * | 5/2006 |
| GB | 2356736 A | * | 5/2001 |
| WO | WO 9923685 A1 | * | 5/1999 |

OTHER PUBLICATIONS

PCT search report of corresponding PCT/US2007/001665 by European Patent Office.*

* cited by examiner

*Primary Examiner*—Jack I Berman

(57) ABSTRACT

An architecture for a ribbon ion beam ion implanter system is disclosed. In one embodiment, the architecture includes an acceleration/deceleration parallelizing lens system for receiving a fanned ribbon ion beam and for at least parallelizing (and perhaps also accelerate or decelerate) the fanned ribbon ion beam into a substantially parallel ribbon ion beam, and an energy filter system downstream from the acceleration/deceleration parallelizing lens system and prior to a work piece to be implanted by the substantially parallel ribbon ion beam. The acceleration/deceleration parallelizing lens system includes lenses for at least parallelizing (and perhaps also accelerate or decelerate) the fanned ribbon ion beam and acceleration/deceleration lenses for accelerating or decelerating the substantially parallel ribbon ion beam. The parallelizing lens allows delivery of a high current ribbon ion beam to the work piece with energy that can extend down to as low as approximately 200 eV. The energy filter system provides a substantially parallel ribbon ion beam that is substantially free of energy contamination.

15 Claims, 3 Drawing Sheets

ARCHITECTURE FOR RIBBON ION BEAM ION IMPLANTER SYSTEM

BACKGROUND OF THE INVENTION

1. Technical Field

The invention relates generally to ion implantation, and more particularly, to architecture for a ribbon ion beam ion implanter system.

2. Background Art

Ion implantation is a standard technique for introducing conductivity altering impurities into, or doping, semiconductor wafers. A typical ion implantation process uses an energetic ion beam to introduce impurities into work pieces, i.e., semiconductor wafers. As is well known, introducing the impurities at a uniform depth and dose into the wafers is important to ensure that semiconductor devices being formed operate properly.

FIG. 1 shows schematically, in three dimensions, a conventional implantation of ions into a wafer. X-Axis and Y-Axis constitute a transverse ion beam scan plane. An ion beam is delivered (desirably) parallel to the Z-Axis and strikes the planar surface of the wafer. The X-Axis is horizontally perpendicular to the Z-Axis. In a ribbon ion beam system, the ion beam is a ribbon along the X-Axis. The Y-Axis is vertically perpendicular to the ion beam plane (i.e., the XZ-coordinate plane). The wafer is scanned up and down along another scan path parallel to the Y-Axis by moving the wafer up and down.

Transport of a low energy (high current) ion beam through an ion implanter system is difficult due to the large defocusing effect of the ion beam's space-charge. This can be alleviated by extracting, and mass-analyzing the beam at a higher energy (e.g., >approximately 10 kV), and then decelerating the beam to a final energy, which can be as low as approximately 200 eV when the ion beam is close to the wafer. However, any ions that get neutralized just before and during deceleration, will not be decelerated fully, and will impinge on the wafer at the higher energy, resulting in harmful energy contamination.

For systems that involve the mass analysis of a ribbon ion beam by dispersion in the plane of the ribbon, resulting in a fanned ribbon ion beam, it is also necessary to parallelize the ion beam, which is currently performed by a sector electromagnet. Controlling the parallelism or angle of an ion beam is important for the proper operation of various different types of devices and processes. The depth at which impurities are implanted depends in part upon the parallelism of an ion beam along a desired direction, typically perpendicular, to the crystal structure of the semiconductor. Therefore, it is important to control the angle of the ion beam during implantation to maintain a desired parallelism (i.e., desired direction) of the ion trajectories relative to a wafer's crystal structure. In particular, in order to achieve repeatable implant results, the angle of the ion beam should be known and controlled to a range of error of less than 1° from parallel to the desired direction, especially for high energy implants and channeled implants. In terms of a fanned ribbon ion beam, if the parallelizing is completed after the deceleration lens, then transport length is added to the system, which further impairs the delivery of the low energy beam to the wafer. Note that such a sector parallelizing lens is quite large, and can add as much as 1 m to the beam transport after deceleration.

In view of the foregoing, there is a need in the art for a way to provide acceleration/deceleration and parallelizing of a ribbon ion beam without adding length to an ion implanter system.

SUMMARY OF THE INVENTION

An architecture for a ribbon ion beam ion implanter system is disclosed. In one embodiment, the architecture includes an acceleration/deceleration parallelizing lens system for receiving a fanned ribbon ion beam and for at least parallelizing (and perhaps also accelerate or decelerate) the fanned ribbon ion beam into a substantially parallel ribbon ion beam, and an energy filter system downstream from the acceleration/deceleration parallelizing lens system and prior to a work piece to be implanted by the substantially parallel ribbon ion beam. The acceleration/deceleration parallelizing lens system includes lenses for at least parallelizing (and perhaps also accelerate or decelerate) the fanned ribbon ion beam and acceleration/deceleration lenses for accelerating or decelerating the substantially parallel ribbon ion beam. The parallelizing lens allows delivery of a high current ribbon ion beam to the work piece with energy that can extend down to as low as approximately 200 eV. The energy filter system provides a substantially parallel ribbon ion beam that is substantially free of energy contamination.

A first aspect of the invention provides an ion implanter system, comprising: a ribbon ion beam generator for generating a fanned ribbon ion beam; an acceleration/deceleration parallelizing lens system downstream of the ribbon ion beam generator for at least parallelizing the fanned ribbon ion beam into a substantially parallel ribbon ion beam; and an energy filter system downstream from the acceleration/deceleration parallelizing lens system and prior to a work piece to be implanted by the substantially parallel ribbon ion beam.

A second aspect of the invention provides a method of ion implanting a work piece, the method comprising the steps of: generating a fanned ribbon ion beam; substantially simultaneously parallelizing and one of accelerating and decelerating the fanned ribbon ion beam into a substantially parallel ribbon ion beam; filtering energy contamination from the ribbon ion beam immediately after the parallelizing step; and implanting the substantially parallel ribbon ion beam into a work piece.

A third aspect of the invention provides an architecture for a ribbon ion beam ion implanter system, the architecture comprising: an acceleration/deceleration parallelizing lens system for receiving a fanned ribbon ion beam and for at least parallelizing the fanned ribbon ion beam into a substantially parallel ribbon ion beam; and an energy filter system downstream from the acceleration/deceleration parallelizing lens system and prior to a work piece to be implanted by the substantially parallel ribbon ion beam.

The illustrative aspects of the present invention are designed to solve the problems herein described and other problems not discussed, which are discoverable by a skilled artisan.

BRIEF DESCRIPTION OF THE DRAWINGS

These and other features of this invention will be more readily understood from the following detailed description of the various aspects of the invention taken in conjunction with the accompanying drawings that depict various embodiments of the invention, in which.

It is noted that the drawings of the invention are not to scale. The drawings are intended to depict only typical aspects of the invention, and therefore should not be considered as limiting the scope of the invention. In the drawings, like numbering represents like elements between the drawings.

DETAILED DESCRIPTION

Figure 1:
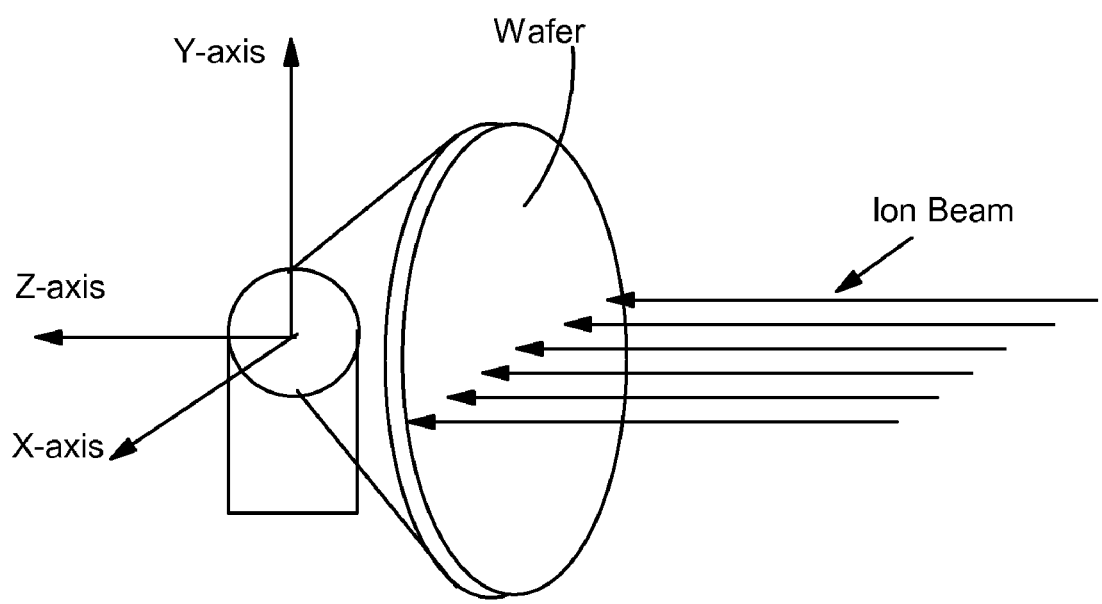
FIG. 1 shows a three-dimensional view of ion beam implantation of a wafer.
Figure 2:
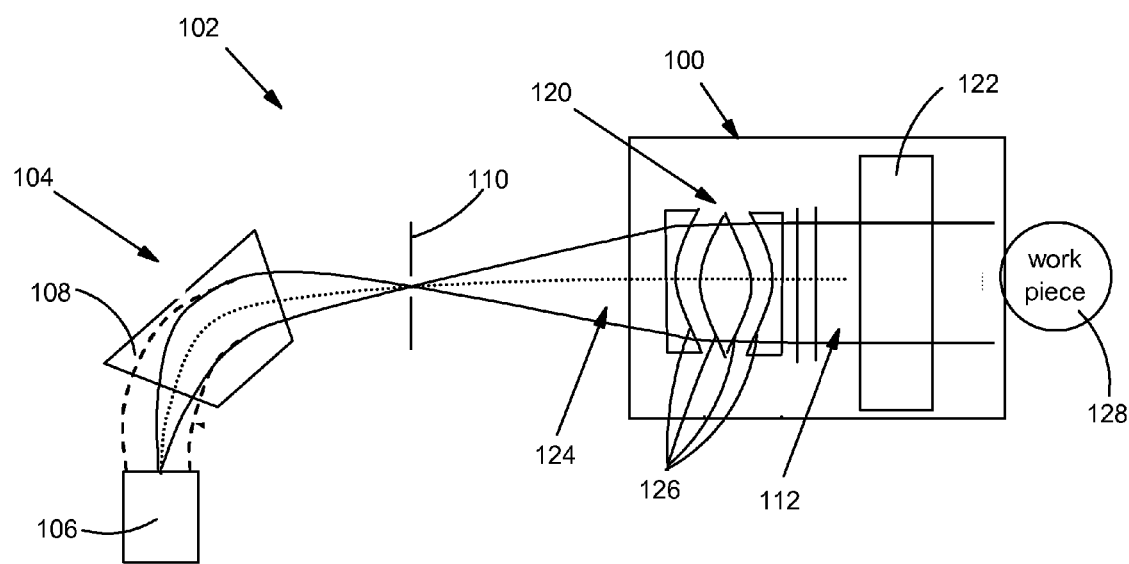
FIG. 2 shows a ribbon ion beam ion implanter system including architecture according to one embodiment of the invention.

Referring to FIG. 2, a ribbon ion beam ion implanter system 102 including architecture 100 according to one embodiment of the invention is shown. Ion implanter system 102 includes a ribbon ion beam generator 104, which may include, for example, an ion source 106, a mass analyzer magnet 108, and a mass resolving aperture 110. Ion implanter system 102 may be a high current system, e.g., delivering an ion beam with over ten milli-Amps (mA). As indicated, the initial ion beam may be generated using conventional narrow slit extraction-point-to-point optics (diverging solid line) or long slit extraction-parallel-to-point optics (parallel dashed line). In any event, mass analyzer magnet 108 refines the initial ion beam. It should be recognized that the above-described ribbon ion beam generator 104 is only illustrative and that other systems may be employed within the scope of the invention.

In one embodiment, architecture 100 includes an acceleration/deceleration parallelizing lens system 120 and an energy filter system 122. Acceleration/deceleration parallelizing lens system 120 (hereinafter "lens system 120") receives a fanned ribbon ion beam 124, i.e., from ribbon ion beam generator 104 and, in particular, mass resolving aperture 110. Fanned ribbon ion beam 124 may expand to, for example, approximately 35 cm. The term "ribbon" indicates that the ion beam is substantially elongated in a lateral direction. Lens system 120 at least parallelizes fanned ribbon ion beam 124 into a substantially parallel ribbon ion beam 112, and may also accelerate or decelerate ribbon ion beam 124. Lens system 120 includes a set of curved electrostatic plates 126 for parallelizing and perhaps accelerating or decelerating fanned ribbon ion beam 124 and a set of acceleration/deceleration lenses 130 for accelerating or decelerating substantially parallel ribbon ion beam 112. Note that because mass resolving aperture 110 provides a fanned ribbon beam 124 that is uniform in height at the set of curved electrostatic plates 126, the slots of these plates (lenses) 126 are required to be of uniform width. Energy filter system 122, downstream from lens system 120, removes energy contamination prior to a work piece 128 to be implanted by substantially parallel ribbon ion beam 112. Energy filter system 122 may include any now known or later developed magnetic or electrostatic (or combination of) energy filtering systems, which customarily bend substantially parallel ribbon ion beam 112 to remove neutral ions.

Lens system 120 allows delivery of substantially parallel ribbon ion beam 112 to work piece 128 with energy that can extend down to as low as approximately 200 eV prior to work piece 128 (after deceleration) because of the shortened distance to work piece 128, which is an improvement in low energy achievement over conventional systems. Energy filter system 122 provides substantially parallel ribbon ion beam 112 that is substantially free of energy contamination. In addition, since the set of at least parallelizing (and perhaps also accelerating or decelerating) lenses 126 and acceleration/deceleration lenses 128 are integrated, the travel distance of substantially parallel ribbon ion beam 112 to work piece 128 is reduced compared to conventional systems. For example, in one embodiment, lens system 120 may have a length of no less than approximately 25 cm and no greater than approximately 30 cm. In addition, in one embodiment, energy filter system 122 may have a length of as low as approximately 20 cm. Cumulatively, architecture 100 could have a length of no great than 50 cm, which is a significant reduction compared to the conventional 1 m length of a sector parallelizing lens alone.

Figure 3:
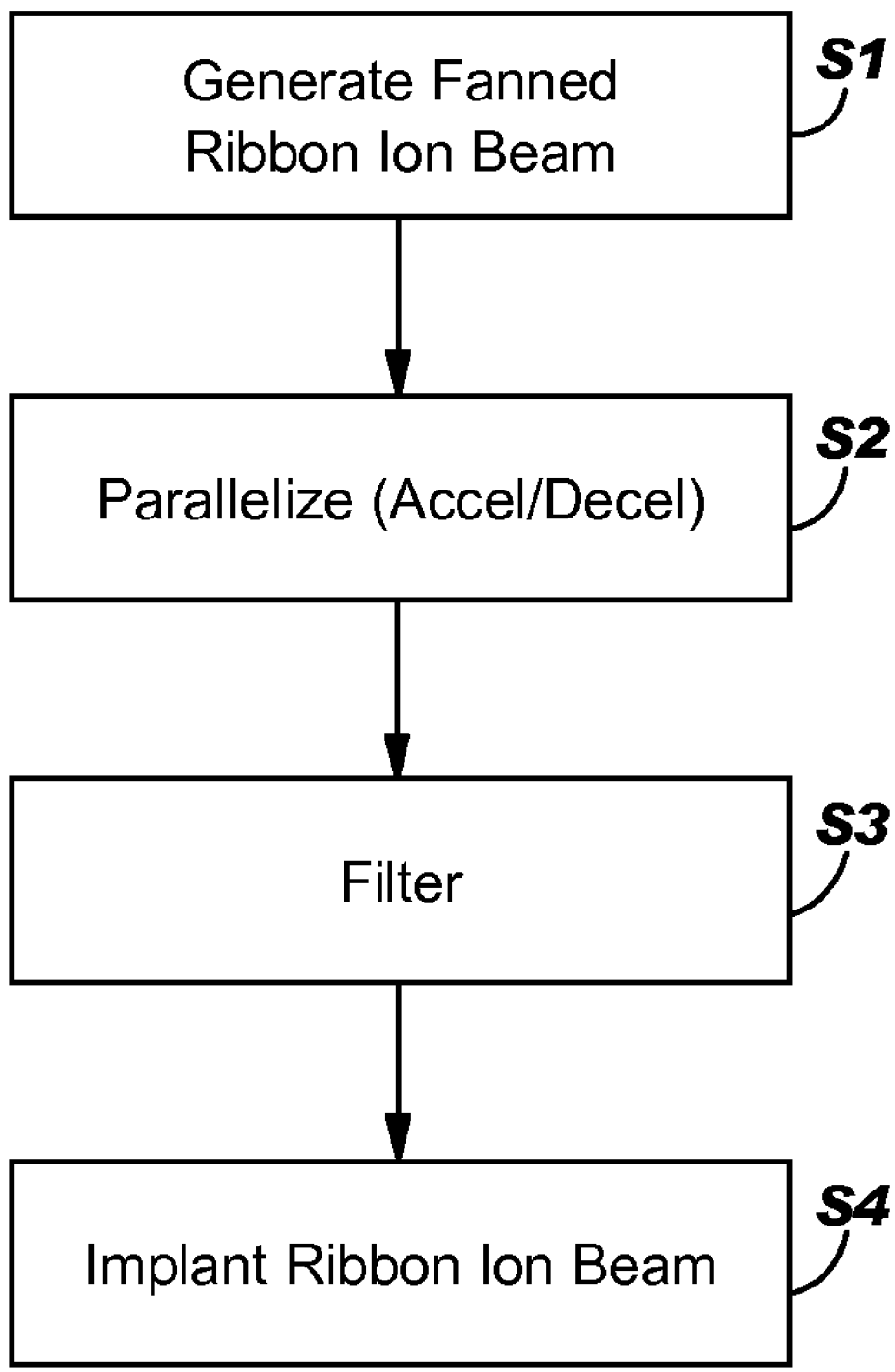
FIG. 3 shows a flow diagram of one embodiment of a method of ion implanting according to the invention.

In another embodiment, shown in the flow diagram of FIG. 3, the invention includes a method of ion implanting a work piece. A first step S1, a fanned ribbon ion beam 124 is generated using, for example, ribbon ion beam generator 104. In one embodiment, ribbon ion beam generator includes an ion source 106, a mass analyzer magnet 108, and a mass resolving aperture 110, which collectively generate a fanned ribbon ion beam 124. Next, in step S2, fanned ribbon ion beam 124 is substantially simultaneously parallelized and one of accelerated and decelerated into a substantially parallel ribbon ion beam 112, e.g., using lens system 120. In step S3, energy contamination is filtered from substantially parallel ribbon ion beam 112, e.g., using energy filter system 122, immediately after the parallelizing step. Finally, in step S4, substantially parallel ribbon ion beam 112 is implanted into a work piece 128.

The foregoing description of various aspects of the invention has been presented for purposes of illustration and description. It is not intended to be exhaustive or to limit the invention to the precise form disclosed, and obviously, many modifications and variations are possible. Such modifications and variations that may be apparent to a person skilled in the art are intended to be included within the scope of the invention as defined by the accompanying claims.

What is claimed is:

1. An ion implanter system, comprising:
   a ribbon ion beam generator configured to generate a fanned ribbon ion beam, the ribbon beam generator comprising a mass resolving aperture;
   an acceleration/deceleration parallelizing lens system directly downstream of the mass resolving aperture of the ribbon ion beam generator, the acceleration/deceleration lens system configured to at least parallelize the fanned ribbon ion beam into a substantially parallel ribbon ion beam without scanning said substantially parallel ribbon ion beam; and
   an energy filter system downstream from the acceleration/deceleration parallelizing lens system and prior to a work piece to be implanted by the substantially parallel ribbon ion beam.

2. The ion implanter system of claim 1, wherein the acceleration/deceleration parallelizing lens system has a length of no less than approximately 25 cm and no greater than approximately 30 cm.

3. The ion implanter system of claim 1, wherein the energy filter system has a length of as low as approximately 20 cm.

4. The ion implanter system of claim 1, wherein the acceleration/deceleration parallelizing lens system includes a set of curved electrostatic plates for at least parallelizing the fanned ribbon ion beam into the substantially parallel ribbon ion beam, and a set of acceleration/deceleration lenses for one of accelerating and deceleration the substantially parallel ribbon ion beam.

5. The ion implanter system of claim 4, wherein the set of curved electrostatic plates also perform one of acceleration and deceleration of the substantially parallel ribbon ion beam.

6. The ion implanter system of claim 1, wherein the substantially parallel ribbon ion beam has an energy as low as approximately 200 eV prior to the work piece.

7. The ion implanter system of claim 1, wherein the substantially parallel ribbon ion beam is substantially free of energy contamination.

8. A method of ion implanting a work piece, the method comprising the steps of:
- outputting a fanned ribbon ion beam generated in a ribbon ion beam generator comprising a mass resolving aperture;
- directing the fanned ribbon ion beam from the mass resolving aperture of the ribbon ion beam generator directly to an acceleration/deceleration parallelizing lens system;
- substantially simultaneously parallelizing and one of accelerating and decelerating the fanned ribbon ion beam into a substantially parallel ribbon ion beam;
- filtering energy contamination from the ribbon ion beam immediately after the parallelizing step; and
- implanting the substantially parallel ribbon ion beam into a work piece without scanning said substantially parallel ribbon ion beam.

9. An architecture for a ribbon ion beam ion implanter system, the architecture comprising:
- an acceleration/deceleration parallelizing lens system configured to receive a fanned ribbon ion beam directly from a mass resolving aperture and to at least parallelize the fanned ribbon ion beam into a substantially parallel ribbon ion beam without scanning said substantially parallel ribbon ion beam; and
- an energy filter system downstream from the acceleration/deceleration parallelizing lens system and prior to a work piece to be implanted by the substantially parallel ribbon ion beam.

10. The ion implanter system of claim 9, wherein the acceleration/deceleration parallelizing lens system has a length of no less than approximately 25 cm and no greater than approximately 30 cm.

11. The ion implanter system of claim 9, wherein the energy filter system has a length of as low as approximately 20 cm.

12. The ion implanter system of claim 9, wherein the acceleration/deceleration parallelizing lens system includes a set of curved electrostatic plates for at least parallelizing the fanned ribbon ion beam into the substantially parallel ribbon ion beam, and a set of acceleration/deceleration lenses for one of accelerating and deceleration the substantially parallel ribbon ion beam.

13. The ion implanter system of claim 12, wherein the set of curved electrostatic plates also perform one of acceleration and deceleration of the substantially parallel ribbon ion beam.

14. The ion implanter system of claim 9, wherein the substantially parallel ribbon ion beam has an energy as low as approximately 200 eV prior to the work piece.

15. The ion implanter system of claim 9, wherein the substantially parallel ribbon ion beam is substantially free of energy contamination.

* * * * *